US012787720B2

(12) United States Patent
Wang

(10) Patent No.: US 12,787,720 B2
(45) Date of Patent: Nov. 3, 2026

(54) METHOD AND APPARATUS FOR WAFER MEASUREMENT

(71) Applicant: NANYA TECHNOLOGY CORPORATION, New Taipei City (TW)

(72) Inventor: Ching-Chung Wang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 365 days.

(21) Appl. No.: 18/636,560

(22) Filed: Apr. 16, 2024

(65) Prior Publication Data

US 2025/0323102 A1 Oct. 16, 2025

(51) Int. Cl.

*H10P 74/00* (2026.01)
*G01R 31/26* (2020.01)
*H10P 72/00* (2026.01)
*H10P 74/20* (2026.01)

(52) U.S. Cl.

CPC .......... *H10P 74/23* (2026.01); *H10P 72/0602* (2026.01); *H10P 74/203* (2026.01); *G01R 31/2601* (2013.01)

(58) Field of Classification Search

CPC .... H10P 74/23; H10P 72/0602; H10P 74/203; G01R 31/2601
USPC ..................................................... 324/754.01
See application file for complete search history.

(56) References Cited

U.S. PATENT DOCUMENTS

2002/0165636 A1* 11/2002 Hasan .................... G05B 17/02 700/121
2003/0210394 A1* 11/2003 Wei .................... G01B 11/0625 356/369
2004/0175850 A1 9/2004 Shimizu et al.
2006/0161284 A1* 7/2006 Ikeno .............. G05B 19/41865 700/99
2007/0038327 A1* 2/2007 Chung ................ G03F 7/70525 700/121
2013/0249537 A1 9/2013 Kahl et al.
2016/0077147 A1 3/2016 Wang et al.
2019/0229023 A1* 7/2019 Shim ...................... G01B 15/00
2024/0085891 A1* 3/2024 Choi ................ G05B 19/41875

FOREIGN PATENT DOCUMENTS

CN 110060936 A 7/2019
TW 202202850 A 1/2022

OTHER PUBLICATIONS

Office Action and and the search report mailed on Jun. 4, 2025 related to Taiwanese Application No. 113122846.
Summary translation of Office Action and and the search report mailed on Jun. 4, 2025 related to Taiwanese Application No. 113122846.

(Continued)

*Primary Examiner* — Raul J Rios Russo
(74) *Attorney, Agent, or Firm* — Xuan Zhang

(57) ABSTRACT

An apparatus and a method for wafer measurement are provided. The method includes the steps of: generating a measurement program associated with a plurality of recipes; and controlling at least one measurement device, by executing the measurement program, to automatically measure a plurality of wafers according to the plurality of recipes.

10 Claims, 8 Drawing Sheets

(56) References Cited

OTHER PUBLICATIONS

Office Action and and the search report mailed on Mar. 9, 2026 related to Taiwanese Application No. 114106633.
Summary translation of Office Action and and the search report mailed on Mar. 9, 2026 related to Taiwanese Application No. 114106633.
Office Action and and the search report mailed on Nov. 29, 2024 related to Taiwanese Application No. 1 113122846.

* cited by examiner

METHOD AND APPARATUS FOR WAFER MEASUREMENT

TECHNICAL FIELD

The present disclosure relates to a method and an apparatus for wafer measurement. Particularly, the present disclosure relates to an improved wafer measurement procedure.

DISCUSSION OF THE BACKGROUND

According to prior art, wafers undergo electrical measurements with measurement apparatus (e.g., probe cards and testers.) The environment parameters (e.g., ambient temperature) of measuring the wafers depend on the properties of the wafer. However, in conventional measurement, the same batch of wafers need to be measured by the measurement program with the same environment parameters (e.g., the same ambient temperature,) which is very inflexible. Further, it takes long time to measure the electronic parameters of the wafers and the environment parameters can only be manually adjusted by an operator after one measurement of the electronic parameters of the wafers is finished, which is very inefficient.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for wafer measurement. The method includes: generating a first recipe for measuring a first part of a plurality of wafers; generating a second recipe for measuring a second part of the plurality of wafers; generating a measurement program associated with the first recipe and the second recipe; and controlling a measurement device, by executing the measurement program, to measure the first part of the plurality of wafers and the second part of the plurality of wafers according to the first recipe and the second recipe respectively.

Another aspect of the present disclosure provides a method for wafer measurement. The method includes: generating a measurement program associated with a plurality of recipes; and controlling at least one measurement device, by executing the measurement program, to automatically measure a plurality of wafers according to the plurality of recipes.

Another aspect of the present disclosure provides an apparatus for wafer measurement. The apparatus includes a processor and a memory. The memory is electrically connected to the processor and includes a main program that, when being executed, causes the processor to: generate a first recipe for measuring a first part of a plurality of wafers; generate a second recipe for measuring a second part of the plurality of wafers; generate a measurement program associated with the first recipe and the second recipe; and control a measurement device, by executing the measurement program, to measure the first part of the plurality of wafers and the second part of the plurality of wafers according to the first recipe and the second recipe respectively.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
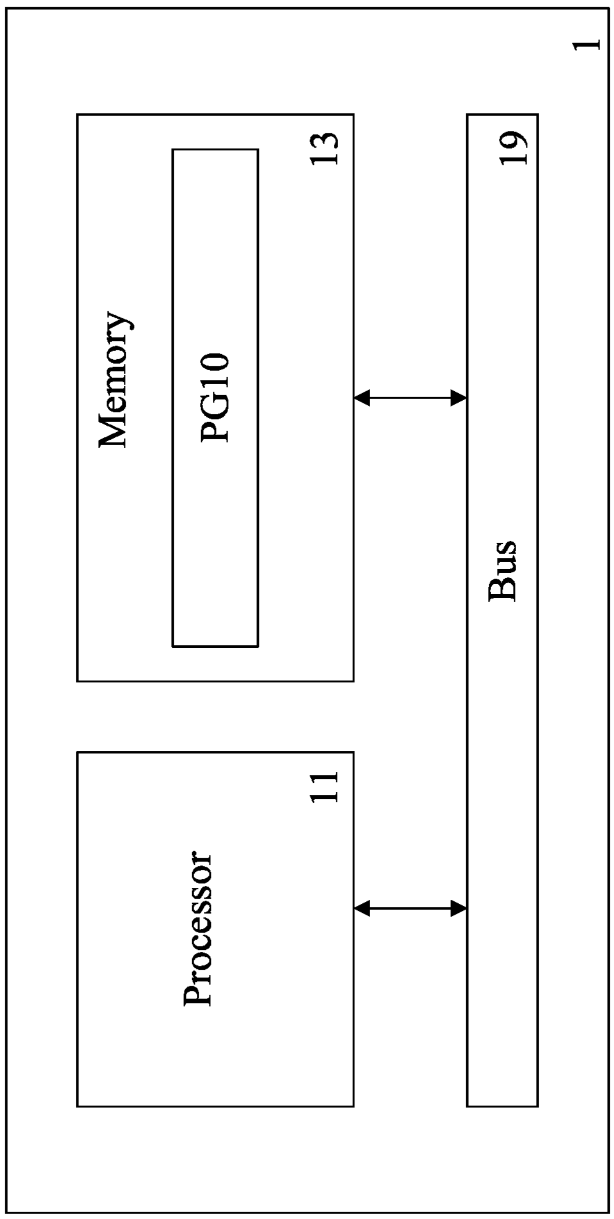
FIG. 1A is a block diagram of an apparatus according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

To perform the wafer measurement more efficiently and more flexibly, an apparatus and a method of the present disclosure may: (1) generate a plurality of recipes for measuring different wafers of the same batch of wafers (e.g., the wafers in the same lot or same carrier); (2) generate a measurement program for measuring different wafers of the same batch of wafers according to respective recipe in desired order; and (3) control a measurement device, by executing the measurement program, to measure different wafers of the same batch of wafers according to respective recipe in the desired order.

FIG. 1A illustrates a block diagram of an apparatus 1 according to some embodiments of the present disclosure. The apparatus 1 includes a processor 11 and a memory 13. The processor 11 and the memory 13 are electrically coupled through a communication bus 19.

The communication bus 19 may allow the processor 11 to execute a main program PG10 stored in the memory 13. When executed, the main program PG10 may generate one or more interrupts (e.g., software-interrupt) to cause the processor 11 to perform functions of the main program PG10 for controlling wafer measurement. The functions of the main program PG10 will be further described hereinafter.

Figure 1B:
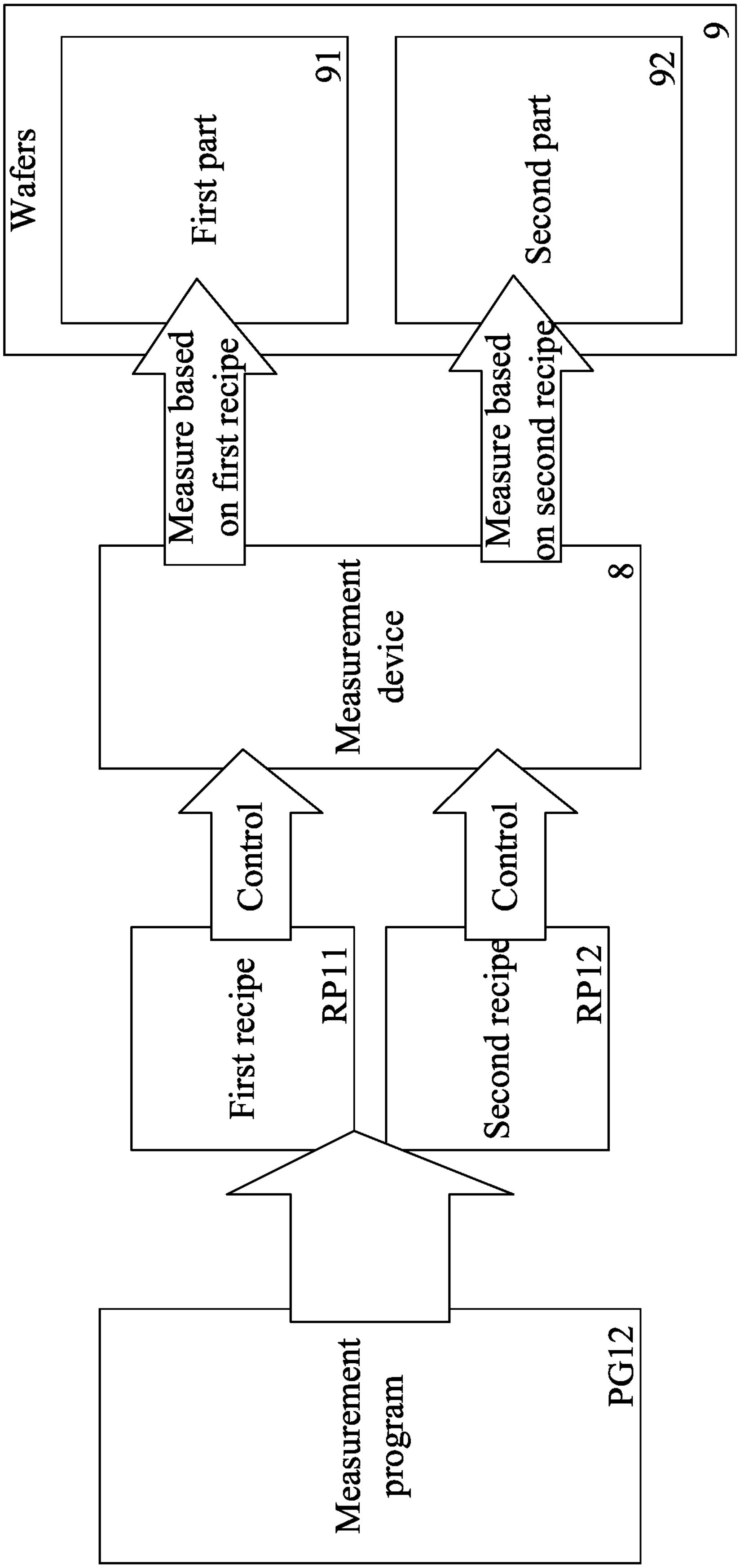
FIG. 1B is a schematic view of measuring wafer according to some embodiments of the present disclosure.

FIG. 1B is a schematic view of measuring wafer according to some embodiments of the present disclosure. In particular, the apparatus 1 may generate: (1) a first recipe RP11 for measuring a first part 91 of a plurality of wafers 9; and (2) a second recipe RP12 for measuring a second part 92 of the plurality of wafers 9.

After generating the first recipe RP11 and the second recipe RP12, the apparatus 1 may generates a measurement program PG12 to be associated with the first recipe RP11 and the second recipe 12. Then, the apparatus 1 may execute the measurement program PG12 to control a measurement device 8 to measure the first part 91 of the plurality of wafers 9 and the second part 92 of the plurality of wafers 9 according to the first recipe RP11 and the second recipe RP12 respectively.

In some embodiments, after executing the measurement program PG12, the apparatus 1 may firstly control the measurement device 8 to measure the first part 91 of the plurality of wafers 9 according to the first recipe RP11, and then automatically control the measurement device 8 to measure the second part 92 of the plurality of wafers 9 according to the second recipe RP12.

Therefore, the apparatus 1 may measure wafers more efficiently and more flexibly since the apparatus 1: (1) generate the recipes RP11, RP12 for measuring different wafers 91, 92 of the same batch of wafers 9; (2) generate the measurement program PG12 for measuring different wafers 91, 92 of the same batch of wafers 9 according to respective recipe RP11, RP12 in desired order; and (3) control the measurement device 8, by executing the measurement program PG12, to measure different wafers 91, 92 of the same batch of wafers 9 according to respective recipe RP11, RP12 in the desired order. Further, the above operations are automatically performed so that the wafers 9 can be measured more precise and more efficiently.

Figure 2A:
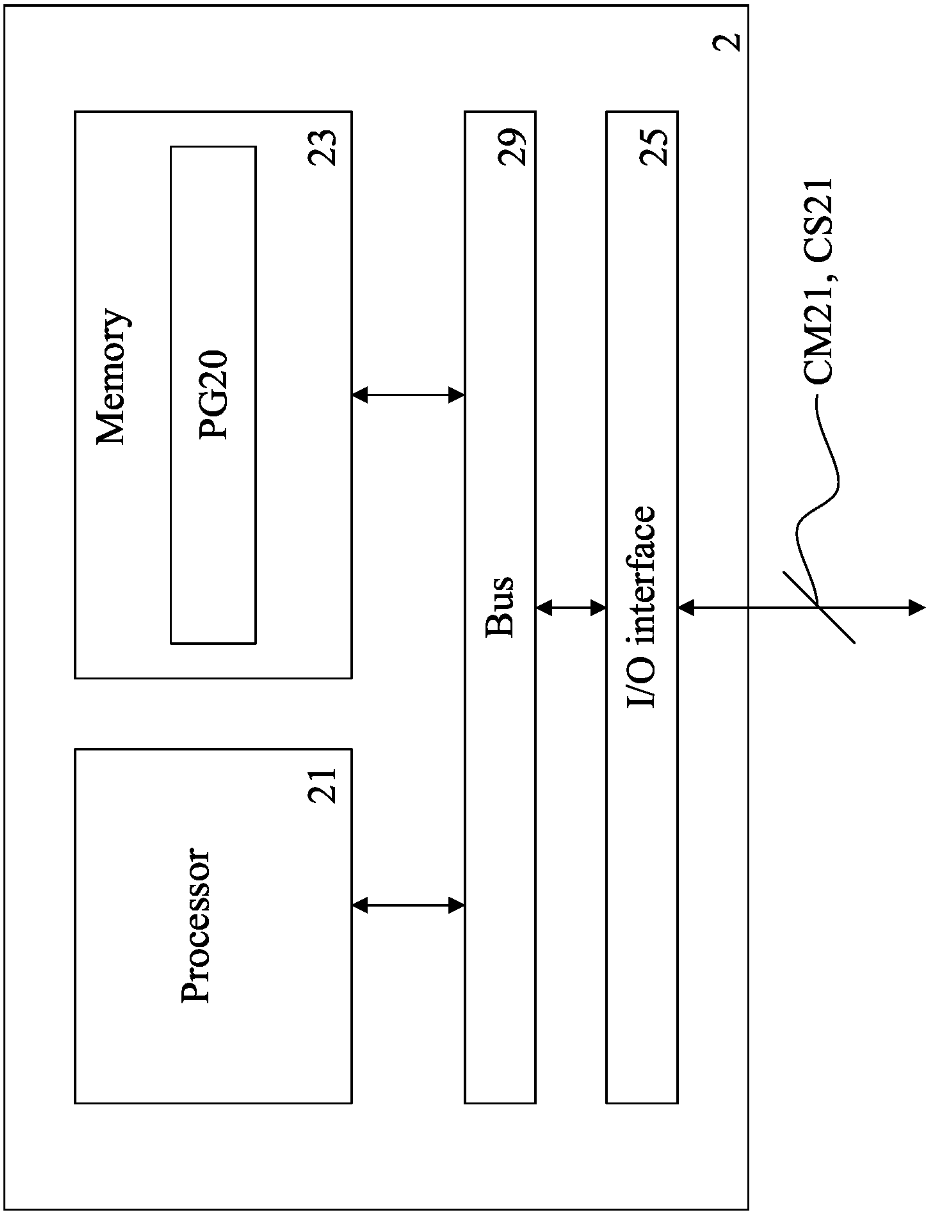
FIG. 2A is a block diagram of an apparatus according to some embodiments of the present disclosure.

FIG. 2A illustrates a block diagram of an apparatus 2 according to some embodiments of the present disclosure. The apparatus 2 includes a processor 21, a memory 23 and an I/O interface 25. The processor 21, the memory 23 and the I/O interface 25 are electrically coupled through a communication bus 29. The apparatus 2 communicates with other device(s) (e.g., transmitting control signal to control external device or receiving command from external device) via the I/O interface 25.

The communication bus 29 may allow the processor 21 to execute a main program PG20 stored in the memory 23. When executed, the main program PG20 may generate one or more interrupts (e.g., software-interrupt) to cause the processor 21 to perform functions of the main program PG20 for controlling wafer measurement. The functions of the main program PG20 will be further described hereinafter.

In some embodiments, the apparatus 2 may receive, through the I/O interface 25, one or more commands CM21 from an external device manipulated by an operator. The one or more commands CM21 may be used to generate different recipes for measuring different wafers. More specifically, after receiving the one or more commands CM21, the apparatus 2 may generate recipes and set parameters of the recipes for measuring different wafers.

In some embodiments, the apparatus 2 may transmit, through the I/O interface 25, one or more control signals CS21 to measurement device(s). The one or more control signals CS21 may be used to control the measurement device(s) to measure the corresponding wafers.

Figure 2B:
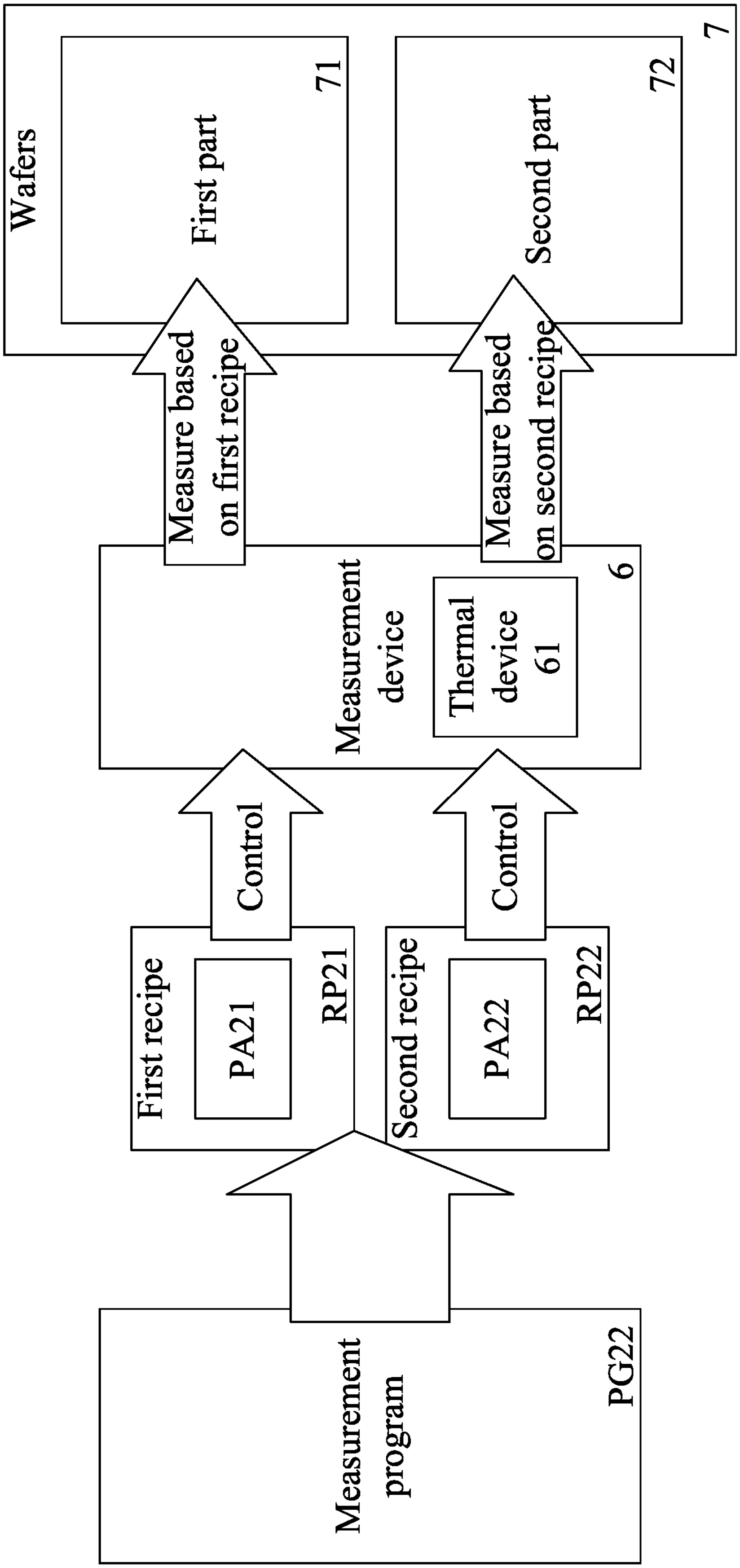
FIG. 2B is a schematic view of measuring wafer according to some embodiments of the present disclosure.

FIG. 2B is a schematic view of measuring wafer according to some embodiments of the present disclosure. In particular, after receiving one or more commands CM21, the apparatus 2 may: generate a first recipe RP21 and set a plurality of first parameters PA21 of the first recipe RP21 for measuring a first part 71 of a plurality of wafers 7; and (2) generate a second recipe RP22 and set a plurality of second parameters PA22 of the second recipe RP22 for measuring a second part 72 of the plurality of wafers 7.

In some embodiments, because conditions for measuring the first part 71 of the wafers 7 may be different from conditions for measuring the second part 72 of the wafers 7, the first recipe RP21 may be different from the second recipe RP22. In some embodiments, if the conditions for measuring the first part 71 of the wafers 7 may be the same as the conditions for measuring the second part 72 of the wafers 7, the first recipe RP21 and the second recipe RP22 may be the same.

After generating the first recipe RP21 and the second recipe RP22, the apparatus 2 may generates a measurement program PG22 to be associated with the first recipe RP21 and the second recipe 22. Then, the apparatus 2 may execute the measurement program PG22 to control (e.g., by the one or more control signals CS21) a measurement device 6 to measure the first part 71 of the plurality of wafers 7 and the second part 72 of the plurality of wafers 7 according to the first recipe RP21 and the second recipe RP22 respectively.

In some embodiments, the measurement device 6 may be controlled to automatically measure the second part 72 of the plurality of wafers 7 according to the second recipe RP22 after measuring the first part 71 of the plurality of wafers 7 according to the first recipe RP21. More specifically, after executing the measurement program PG22, the apparatus 2 may firstly control the measurement device 6 to measure the first part 71 of the plurality of wafers 7 according to the first recipe RP21, and then automatically control the measurement device 6 to measure the second part 72 of the plurality of wafers 7 according to the second recipe RP22.

In some embodiments, the plurality of first parameters PA21 may correspond to a first semiconductor device of the first part 71 of the wafers 7. More specifically, each wafer of the first part 71 of the wafers 7 may have the same first semiconductor device, and the plurality of first parameters PA21 may be set for measuring the first semiconductor device of the first part 71 of the wafers 7.

In some embodiments, the plurality of first parameters PA21 may include at least one of: (1) a first probe pattern of probes of the measurement device 6; (2) a first measurement algorithm; and (3) a first measurement temperature.

In some implementations, the first pattern of probes of the measurement device 6 may correspond to contacts of the first semiconductor device. Specifically, one or more contacts of the first semiconductor device may need to be contacted by the probes of the measurement device 6 for measuring electrical properties of the first semiconductor device. Accordingly, a pattern (i.e., the first pattern) of probes of the measurement device 6 corresponding to the one or more contacts of the first semiconductor device may be preset so that the measurement device 6 may identify the corresponding probes and use the corresponding probes to measure the first semiconductor device.

In some implementations, the first pattern may include coordinate(s) of the probes of the measurement device 6 corresponding to the one or more contacts of the first semiconductor device. In some implementations, the first pattern may include location image(s) of the probes of the measurement device 6 corresponding to the one or more contacts of the first semiconductor device.

In some implementations, the first measurement algorithm may correspond to a first arrangement of electrical property measurement. Specifically, the first semiconductor device may have some under-test electrical properties, and these under-test electrical properties may need to be measured in some specific orders. Accordingly, an arrangement of under-test electrical properties (i.e., the first arrangement of electrical property measurement) may be preset so that the measurement device 6 may identify the corresponding arrangement for the measurement device 6 to measure the first semiconductor device.

In some implementations, the first measurement temperature may be an environment temperature to measure the first part 71 of the plurality of the wafers 7. Specifically, the measurement device 6 may include a thermal device 61 for changing environment temperature. Accordingly, when the first part 71 of the plurality of the wafers 7 needs to be measured under a specific temperature (i.e., the first measurement temperature,) the apparatus 2 may control the thermal device 61 of the measurement device 6 to change a measurement environment temperature to the first measurement temperature so that the measurement device 6 may measure the first part 71 of the plurality of the wafers 7 under the measurement environment temperature.

In some embodiments, the plurality of second parameters PA22 may correspond to a second semiconductor device of the second part 72 of the wafers 7. More specifically, each wafer of the second part 72 of the wafers 7 may have the same second semiconductor device, and the plurality of second parameters PA22 may be set for measuring the second semiconductor device of the second part 72 of the wafers 7.

In some embodiments, the plurality of second parameters PA22 may include at least one of: (1) a second probe pattern of probes of the measurement device 6; (2) a second measurement algorithm; and (3) a second measurement temperature.

In some implementations, the second pattern of probes of the measurement device 6 may correspond to contacts of the second semiconductor device. Specifically, one or more contacts of the second semiconductor device may need to be contacted by the probes of the measurement device 6 for measuring electrical properties of the second semiconductor device. Accordingly, a pattern (i.e., the second pattern) of probes of the measurement device 6 corresponding to the one or more contacts of the second semiconductor device may be preset so that the measurement device 6 may identify the corresponding probes and use the corresponding probes to measure the second semiconductor device.

In some implementations, the second pattern may include coordinate(s) of the probes of the measurement device 6 corresponding to the one or more contacts of the second semiconductor device. In some implementations, the second pattern may include location image(s) of the probes of the measurement device 6 corresponding to the one or more contacts of the second semiconductor device.

In some implementations, the second measurement algorithm may correspond to a second arrangement of electrical property measurement. Specifically, the second semiconductor device may have some under-test electrical properties, and these under-test electrical properties may need to be measured in some specific orders. Accordingly, an arrangement of under-test electrical properties (i.e., the second arrangement of electrical property measurement) may be preset so that the measurement device 6 may identify the corresponding arrangement for the measurement device 6 to measure the second semiconductor device.

In some implementations, the second measurement temperature may be an environment temperature to measure the second part 72 of the plurality of the wafers 7. Specifically, when the second part 72 of the plurality of the wafers 7 needs to be measured under a specific temperature (i.e., the second measurement temperature,) the apparatus 2 may control the thermal device 61 of the measurement device 6 to change the measurement environment temperature to the second measurement temperature so that the measurement device 6 may measure the second part 72 of the plurality of the wafers 7 under the measurement environment temperature.

Figure 2C:
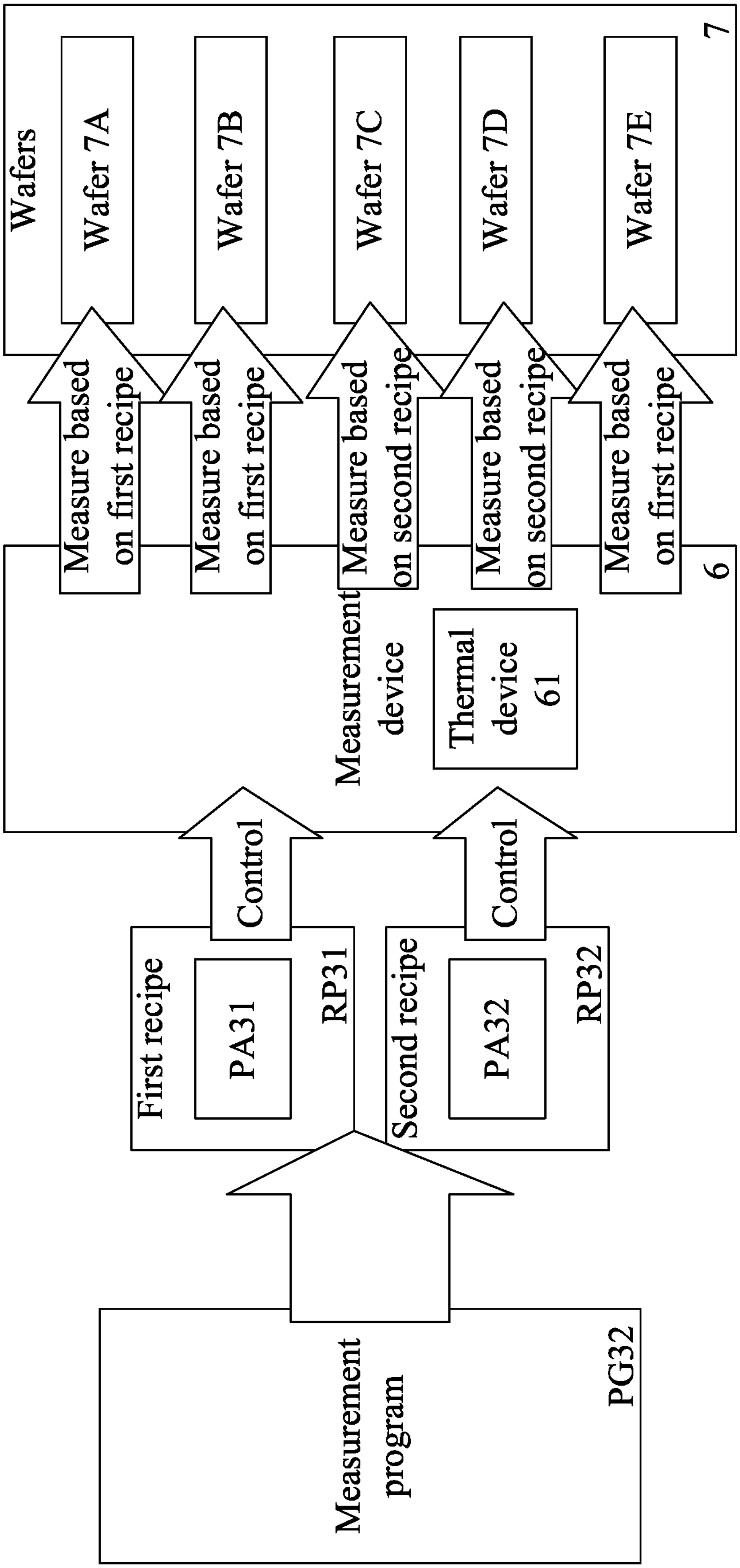
FIG. 2C is a schematic view of measuring wafer according to some embodiments of the present disclosure.

FIG. 2C is a schematic view of measuring wafer according to some embodiments of the present disclosure. In particular, after receiving one or more commands CM21, the apparatus 2 may: generate a first recipe RP31 and set a plurality of first parameters PA31 of the first recipe RP31 for measuring wafers 7A, 7B and 7E of the plurality of wafers 7; and (2) generate a second recipe RP32 and set a plurality of second parameters PA32 of the second recipe RP32 for measuring wafers 7C and 7D of the plurality of wafers 7.

In some embodiments, because conditions for measuring the wafers 7A, 7B and 7E may be different from conditions for measuring the wafers 7C and 7D of the wafers 7, the first recipe RP31 may be different from the second recipe RP32.

After generating the first recipe RP31 and the second recipe RP32, the apparatus 2 may generates a measurement program PG32 to be associated with the first recipe RP31 and the second recipe 32. Then, the apparatus 2 may execute the measurement program PG22 to control (e.g., by the one or more control signals CS21) the measurement device 6 to measure the wafers 7A, 7B and 7E according to the first recipe RP31 and to measure the wafers 7C and 7D according to the second recipe RP32.

In some embodiments, the measurement device 6 may be controlled to automatically measure the wafers 7C and 7D according to the second recipe RP32 after measuring the wafers 7A, 7B and 7E according to the first recipe RP31. More specifically, after executing the measurement program PG22, the apparatus 2 may firstly control the measurement device 6 to measure the wafers 7A, 7B and 7E according to the first recipe RP31, and then automatically control the measurement device 6 to measure the wafers 7C and 7D according to the second recipe RP32.

In some embodiments, the measurement device 6 may be controlled to automatically measure the wafers 7C and 7D according to the second recipe RP32 after measuring the wafers 7A and 7B according to the first recipe RP31, and then be controlled to automatically measure the wafer 7E according to the first recipe RP31 after measuring the wafers 7C and 7D according to the second recipe RP32. More specifically, after executing the measurement program PG22, the apparatus 2 may: (1) firstly control the measurement device 6 to measure the wafers 7A and 7B according to the first recipe RP31; (2) automatically control the measurement device 6 to measure the wafers 7C and 7D according to the second recipe RP32; and (3) automatically control the measurement device 6 to measure the wafer 7E according to the first recipe RP31.

In some embodiments, the plurality of first parameters PA21 may correspond to a first semiconductor device of the wafers 7A, 7B and 7E. More specifically, each of the wafers 7A, 7B and 7E may have the same first semiconductor device, and the plurality of first parameters PA31 may be set for measuring the first semiconductor device of the wafers 7A, 7B and 7E.

In some embodiments, the plurality of first parameters PA31 may include at least one of: (1) a first probe pattern of probes of the measurement device 6; (2) a first measurement algorithm; and (3) a first measurement temperature.

In some implementations, the first pattern of probes of the measurement device 6 may correspond to contacts of the first semiconductor device. Specifically, one or more contacts of the first semiconductor device may need to be contacted by the probes of the measurement device 6 for measuring electrical properties of the first semiconductor device. Accordingly, a pattern (i.e., the first pattern) of probes of the measurement device 6 corresponding to the one or more contacts of the first semiconductor device may be preset so that the measurement device 6 may identify the corresponding probes and use the corresponding probes to measure the first semiconductor device.

In some implementations, the first measurement algorithm may correspond to a first arrangement of electrical property measurement. Specifically, the first semiconductor device may have some under-test electrical properties, and these under-test electrical properties may need to be measured in some specific orders. Accordingly, an arrangement of under-test electrical properties (i.e., the first arrangement of electrical property measurement) may be preset so that the measurement device 6 may identify the corresponding arrangement for the measurement device 6 to measure the first semiconductor device.

In some implementations, the first measurement temperature may be an environment temperature to measure the wafers 7A, 7B and 7E. Specifically, the measurement device 6 may include the thermal device 61 for changing environment temperature. Accordingly, when the wafers 7A, 7B and 7E needs to be measured under a specific temperature (i.e., the first measurement temperature,) the apparatus 2 may control the thermal device 61 of the measurement device 6 to change a measurement environment temperature to the first measurement temperature so that the measurement device 6 may measure the wafers 7A, 7B and 7E under the measurement environment temperature.

In some embodiments, the plurality of second parameters PA32 may correspond to a second semiconductor device of the wafers 7C and 7D. More specifically, each of the wafers 7C and 7D may have the same second semiconductor device, and the plurality of second parameters PA32 may be set for measuring the second semiconductor device of the wafers 7C and 7D.

In some embodiments, the plurality of second parameters PA32 may include at least one of: (1) a second probe pattern of probes of the measurement device 6; (2) a second measurement algorithm; and (3) a second measurement temperature.

In some implementations, the second pattern of probes of the measurement device 6 may correspond to contacts of the second semiconductor device. Specifically, one or more contacts of the second semiconductor device may need to be contacted by the probes of the measurement device 6 for measuring electrical properties of the second semiconductor device. Accordingly, a pattern (i.e., the second pattern) of probes of the measurement device 6 corresponding to the one or more contacts of the second semiconductor device may be preset so that the measurement device 6 may identify the corresponding probes and use the corresponding probes to measure the second semiconductor device.

In some implementations, the second measurement algorithm may correspond to a second arrangement of electrical property measurement. Specifically, the second semiconductor device may have some under-test electrical properties, and these under-test electrical properties may need to be measured in some specific orders. Accordingly, an arrangement of under-test electrical properties (i.e., the second arrangement of electrical property measurement) may be preset so that the measurement device 6 may identify the corresponding arrangement for the measurement device 6 to measure the second semiconductor device.

In some implementations, the second measurement temperature may be an environment temperature to measure the wafers 7C and 7D. Specifically, when the wafers 7C and 7D needs to be measured under a specific temperature (i.e., the second measurement temperature,) the apparatus 2 may control the thermal device 61 of the measurement device 6 to change the measurement environment temperature to the second measurement temperature so that the measurement device 6 may measure the wafers 7C and 7D under the measurement environment temperature.

Figure 2D:
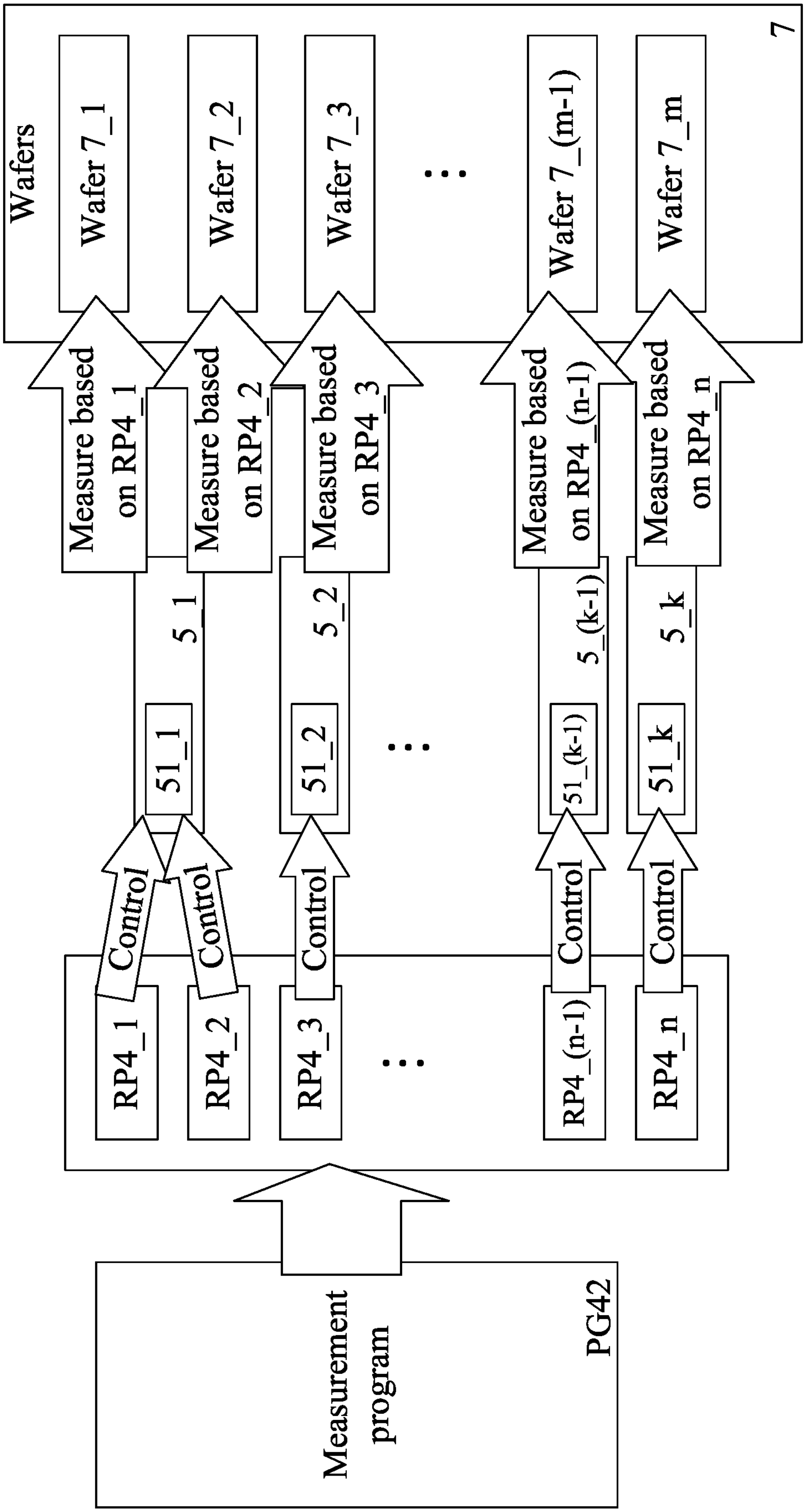
FIG. 2D is a schematic view of measuring wafer according to some embodiments of the present disclosure.

FIG. 2D is a schematic view of measuring wafer according to some embodiments of the present disclosure. In particular, after receiving one or more commands CM21, the apparatus 2 may: generate a plurality of recipes RP4_1 to RP4_*n* for measuring wafers 7_1 to 7_*m* of the plurality of wafers 7.

In some embodiments, because conditions for measuring the wafers 7_1 to 7_*m* may be different, the recipes RP4_1 to RP4_*n* corresponding to the wafers 7_1 to 7_*m* may be different. In some embodiments, the correspondences between the recipes RP4_1 to RP4_*n* and the wafers 7_1 to 7_*m* may be one-to-one (e.g., one recipe to one wafer), many-to-one (e.g., many recipes to one wafer) or one-to-many (e.g., one recipe to many wafers.)

After generating the recipes RP4_1 to RP4_n, the apparatus 2 may generates a measurement program PG42 to be associated with the recipes RP4_1 to RP4_n. Then, the apparatus 2 may execute the measurement program PG42 to control (e.g., by the one or more control signals CS21) measurement devices 5_1 to 5_k to measure the wafers 7_1 to 7_m according to the recipes RP4_1 to RP4_n. The measurement devices 5_1 to 5_k may be controlled to automatically measure the wafers 7_1 to 7_m according to the recipes RP4_1 to RP4_n.

In some embodiments, one of the measurement devices 5_1 to 5_k may be controlled to automatically measure some of the wafers 7_1 to 7_m sequentially. For example, the recipe RP4_1 corresponding to the wafer 7_1 includes a first designated temperature, and the recipe RP4_2 corresponding to the wafer 7_2 includes a second designated temperature. The apparatus 2 controls a thermal device 51_1 of the measurement device 5_1 to change a measurement environment temperature to the first designated temperature, and then controls the measurement device 5_1 to measure the wafer 7_1 under the first designated temperature. After measuring the wafer 7_1, the apparatus 2 controls the thermal device 51_1 of the measurement device 5_1 to change the measurement environment temperature of the measurement device 5_1 to the second designated temperature, and then controls the measurement device 5_1 to measure the wafer 7_2 under the second designated temperature.

In some embodiments, some of the measurement devices 5_1 to 5_k may measure some of the wafers 7_1 to 7_m parallel. For example, the recipe RP4_(n−1) corresponding to the wafer 7_(m−1) includes a first designated temperature, and the recipe RP4_n corresponding to the wafer 7_m includes a second designated temperature. The apparatus 2 controls a thermal device 51_(k−1) of the measurement device 5_(k−1) to change a measurement environment temperature of the measurement device 5_(k−1) to the first designated temperature; meanwhile, the apparatus 2 controls a thermal device 51_k of the measurement device 5k to change a measurement environment temperature of the measurement device 5k to the second designated temperature. Then, the apparatus 2 controls the measurement device 5_(k−1) to measure the wafer 7_(m−1) under the first designated temperature; meanwhile, the apparatus 2 controls the measurement device 5_k to measure the wafer 7_m under the second designated temperature.

Figure 3:
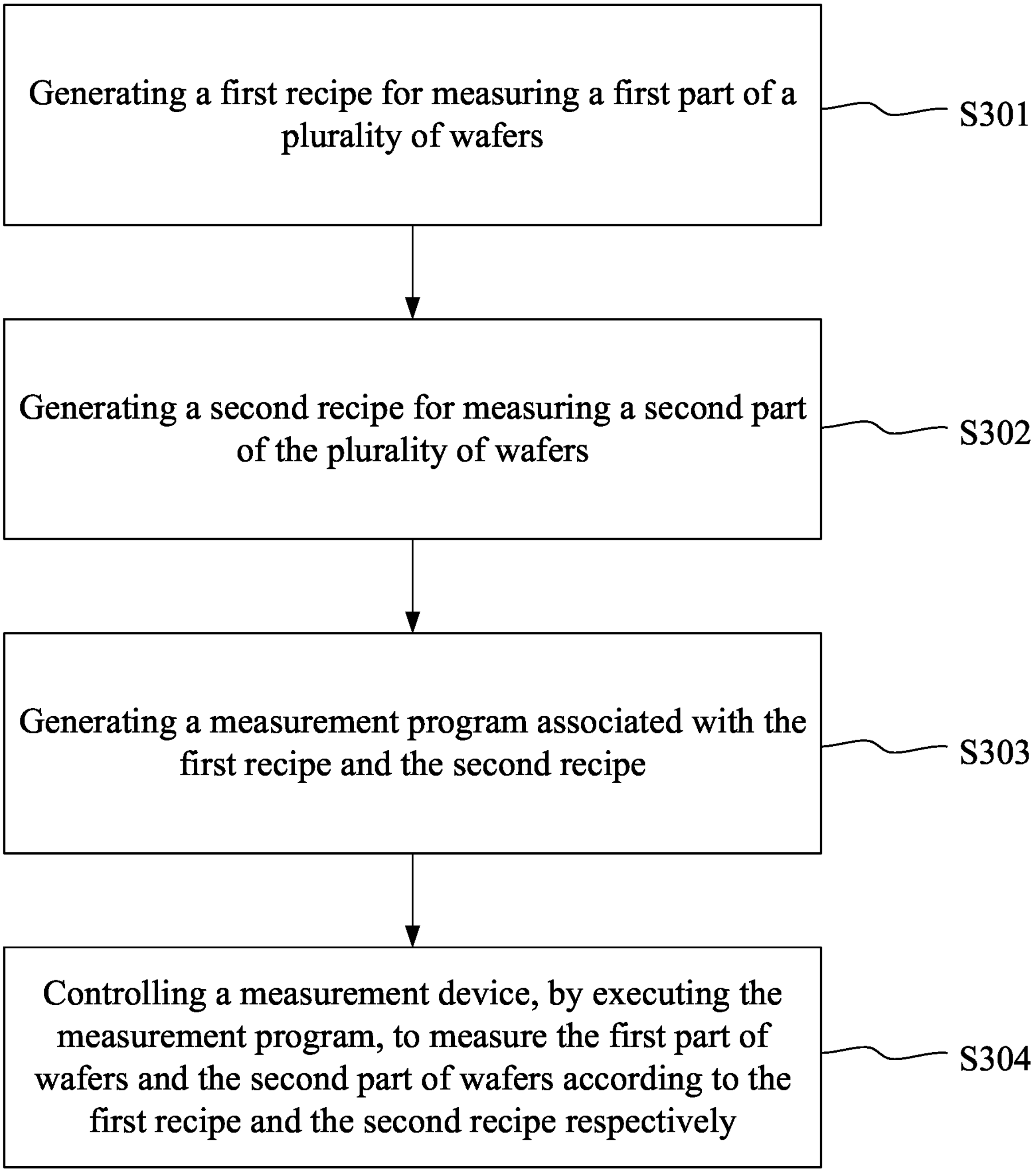
FIG. 3 is a flow diagram illustrating a method for wafer measurement in accordance with some embodiments of the present disclosure.

Some embodiments of the present disclosure include a method for wafer measurement, and a flowchart diagram thereof is shown in FIG. 3. The method of some embodiments is for use in an apparatus (e.g., the apparatus of the aforesaid embodiments). Detailed steps of the method are described below.

Step S301 is executed, by the apparatus, to generate a first recipe for measuring a first part of a plurality of wafers. Step S302 is executed, by the apparatus, to generate a second recipe for measuring a second part of the plurality of wafers. Step S330 is executed, by the apparatus, to generate a measurement program associated with the first recipe and the second recipe. Step S304 is executed, by the apparatus, to control a measurement device, by executing the measurement program, to measure the first part of the plurality of wafers and the second part of the plurality of wafers according to the first recipe and the second recipe respectively.

In some embodiments, the step S304 may include sub-steps. In particular, when the step S304 is executed, the apparatus may further: control a thermal device of the measurement device, by executing the measurement program, to change a measurement environment temperature to a first measurement temperature of the first recipe; and control the measurement device, by executing the measurement program, to measure the first part of the plurality of wafers according to the first recipe under the measurement environment temperature.

In some embodiments, the step S304 may include sub-steps. In particular, when the step S304 is executed, the apparatus may further: control the thermal device of the measurement device, by executing the measurement program, to change the measurement environment temperature to a second measurement temperature of the second recipe; and control the measurement device, by executing the measurement program, to measure the second part of the plurality of wafers according to the second recipe under the measurement environment temperature.

In some embodiments, the sub-steps of the step S304 may be automatically performed by executing the measurement program.

Figure 4:
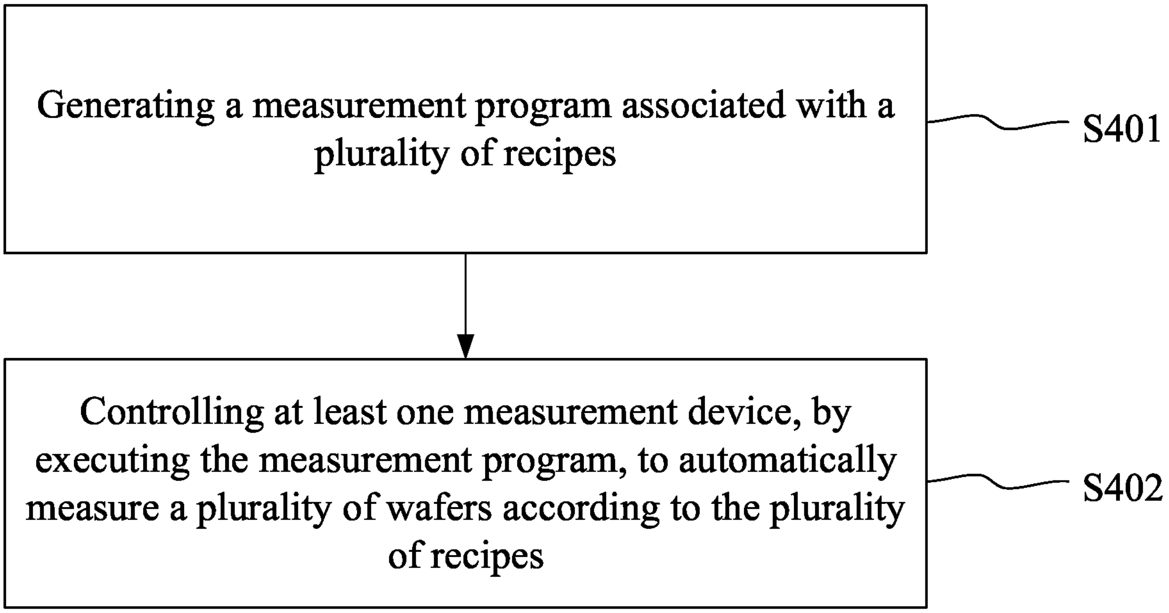
FIG. 4 is a flow diagram illustrating a method for wafer measurement in accordance with some embodiments of the present disclosure.

Some embodiments of the present disclosure include a method for wafer measurement, and a flowchart diagram thereof is shown in FIG. 4. The method of some embodiments is for use in an apparatus (e.g., the apparatus of the aforesaid embodiments). Detailed steps of the method are described below.

Step S401 is executed, by the apparatus, to generate a measurement program associated with a plurality of recipes. Step S402 is executed, by the apparatus, to control at least one measurement device, by executing the measurement program, to automatically measure a plurality of wafers according to the plurality of recipes.

In some embodiments, the step S402 may include sub-steps. In particular, when the step S402 is executed, the apparatus may further: control a first measurement device of the at least one measurement device, by executing the measurement program, to automatically measure the plurality of wafers according to the plurality of recipes sequentially. More specifically, the apparatus may: control a thermal device of the first measurement device, by executing the measurement program, to change a measurement environment temperature to a plurality designated temperatures of the plurality of recipes sequentially; and control the first measurement device, by executing the measurement program, to measure the plurality of wafers under the plurality of measurement environment temperatures respectively.

In some embodiments, the step S402 may include sub-steps. In particular, when the step S402 is executed, the apparatus may further: control a first measurement device of the at least one measurement device, by executing the measurement program, to automatically measure the plurality of wafers according to the plurality of recipes in parallel. More specifically, the apparatus may: control a plurality of thermal devices of the plurality of measurement devices, by executing the measurement program, to change a plurality of measurement environment temperatures of the plurality of measurement devices to the designated temperatures respectively in parallel; and control the plurality of measurement devices, by executing the measurement program, to measure the plurality of wafers under the plurality of measurement environment temperatures respectively.

Therefore, the present disclosure provides an apparatus and a method for measuring wafers more efficient and more flexible since the apparatus and the method of the present disclosure: (1) generate a plurality of recipes for measuring different wafers of the same batch of wafers; (2) generate a measurement program for measuring different wafers of the same batch of wafers according to respective recipe in desired order; and (3) control a measurement device, by executing the measurement program, to measure different wafers of the same batch of wafers according to respective recipe in the desired order. Further, the above operations are automatically performed so that the wafers can be measured more precise and more efficient.

One aspect of the present disclosure provides a method for wafer measurement. The method includes: generating a first recipe for measuring a first part of a plurality of wafers; generating a second recipe for measuring a second part of the plurality of wafers; generating a measurement program associated with the first recipe and the second recipe; and controlling a measurement device, by executing the measurement program, to measure the first part of the plurality of wafers and the second part of the plurality of wafers according to the first recipe and the second recipe respectively.

In some embodiments, the first recipe includes a plurality of first parameters corresponding to the first part of the plurality of wafers.

In some embodiments, the plurality of first parameters correspond to a first semiconductor device of the first part of the plurality of wafers.

In some embodiments, the plurality of first parameters includes at least one of a first probe pattern of probes of the measurement device, a first measurement algorithm and a first measurement temperature.

In some embodiments, the first probe pattern corresponds to contacts of the first semiconductor device.

In some embodiments, the first measurement algorithm corresponds to a first arrangement of electrical property measurement.

In some embodiments, the step of controlling the measurement device, by executing the measurement program, to measure the first part of the plurality of wafers according to the first recipe further includes: controlling a thermal device of the measurement device, by executing the measurement program, to change a measurement environment temperature to the first measurement temperature; and controlling the measurement device, by executing the measurement program, to measure the first part of the plurality of wafers according to the first recipe under the measurement environment temperature.

In some embodiments, the second recipe includes a plurality of second parameters corresponding to the second part of the plurality of wafers, and the second recipe is different from the first recipe.

In some embodiments, the plurality of second parameters correspond to a second semiconductor device of the second part of the plurality of wafers.

In some embodiments, the plurality of second parameters includes at least one of a second probe pattern of the probes of the measurement device, a second measurement algorithm and a second measurement temperature.

In some embodiments, the second probe pattern corresponds to contacts of the second semiconductor device.

In some embodiments, the second measurement algorithm corresponds to a second arrangement of electrical property measurement.

In some embodiments, the step of controlling the measurement device, by executing the measurement program, to measure the first part of the plurality of wafers according to the first recipe further includes: controlling a thermal device of the measurement device, by executing the measurement program, to change a measurement environment temperature to a second temperature according to the second measurement temperature; and controlling the measurement device, by executing the measurement program, to measure the second part of the plurality of wafers according to the second recipe under the measurement environment temperature.

In some embodiments, wherein, by executing the measurement program, the measurement device is controlled to automatically measure the second part of the plurality of wafers according to the second recipe after measuring the first part of the plurality of wafers according to the first recipe.

Another aspect of the present disclosure provides a method for wafer measurement. The method includes: generating a measurement program associated with a plurality of recipes; and controlling at least one measurement device, by executing the measurement program, to automatically measure a plurality of wafers according to the plurality of recipes.

In some embodiments, the step of controlling the at least one measurement device to automatically measure the plurality of wafers according to the plurality of recipes further includes: controlling a first measurement device of the at least one measurement device, by executing the measurement program, to automatically measure the plurality of wafers according to the plurality of recipes sequentially.

In some embodiments, each recipe includes a designated temperature.

In some embodiments, the step of controlling the first measurement device to automatically measure the plurality of wafers according to the plurality of recipes sequentially further includes: controlling a thermal device of the first measurement device, by executing the measurement program, to change a measurement environment temperature to the designated temperatures sequentially; and controlling the first measurement device, by executing the measurement program, to measure the plurality of wafers under the plurality of measurement environment temperatures respectively.

In some embodiments, the at least one measurement device includes a plurality of measurement devices, and the step of controlling the at least one measurement device to automatically measure the plurality of wafers according to the plurality of recipes further includes: controlling the plurality of measurement devices, by executing the measurement program, to automatically measure the plurality of wafers according to the plurality of recipes in parallel.

In some embodiments, each recipe includes a designated temperature.

In some embodiments, the step of controlling the plurality of measurement devices to automatically measure the plurality of wafers according to the plurality of recipes in parallel further includes: controlling a plurality of thermal devices of the plurality of measurement devices, by executing the measurement program, to change a plurality of measurement environment temperatures of the plurality of measurement devices to the designated temperatures respectively in parallel; and controlling the plurality of measurement devices, by executing the measurement program, to measure the plurality of wafers under the plurality of measurement environment temperatures respectively.

Another aspect of the present disclosure provides an apparatus method for wafer measurement. The apparatus includes: a processor and a memory. The memory is electrically connected to the processor and includes a main program that, when being executed, causes the processor to: generate a first recipe for measuring a first part of a plurality of wafers; generate a second recipe for measuring a second part of the plurality of wafers; generate a measurement program associated with the first recipe and the second recipe; and control a measurement device, by executing the measurement program, to measure the first part of the plurality of wafers and the second part of the plurality of wafers according to the first recipe and the second recipe respectively.

In some embodiments, the apparatus further includes an I/O interface configured to receive command for setting the first recipe including a plurality of first parameters corresponding to the first part of the plurality of wafers.

In some embodiments, the plurality of first parameters correspond to a first semiconductor device of the first part of the plurality of wafers.

In some embodiments, the plurality of first parameters includes at least one of a first probe pattern of probes of the measurement device, a first measurement algorithm and a first measurement temperature.

In some embodiments, the first probe pattern corresponds to contacts of the first semiconductor device.

In some embodiments, the first measurement algorithm corresponds to a first arrangement of electrical property measurement.

In some embodiments, the main program, when being executed, further causes the processor to: control a thermal device of the measurement device, by executing the measurement program, to change a measurement environment temperature to the first measurement temperature; and control the measurement device, by executing the measurement program, to measure the first part of the plurality of wafers according to the first recipe under the measurement environment temperature.

In some embodiments, the apparatus further includes an I/O interface configured to receive command for setting the second recipe including a plurality of second parameters corresponding to the second part of the plurality of wafers. The second recipe is different from the first recipe.

In some embodiments, the plurality of second parameters correspond to a second semiconductor device of the second part of the plurality of wafers.

In some embodiments, the plurality of second parameters includes at least one of a second probe pattern of the probes of the measurement device, a second measurement algorithm and a second measurement temperature.

In some embodiments, the second probe pattern corresponds to contacts of the second semiconductor device.

In some embodiments, the second measurement algorithm corresponds to a second arrangement of electrical property measurement.

In some embodiments, the main program, when being executed, further causes the processor to: control a thermal device of the measurement device, by executing the measurement program, to change a measurement environment temperature to a second temperature according to the second measurement temperature; and control the measurement device, by executing the measurement program, to measure the second part of the plurality of wafers according to the second recipe under the measurement environment temperature.

In some embodiments, by executing the measurement program, the measurement device is controlled to automatically measure the second part of the plurality of wafers according to the second recipe after measuring the first part of the plurality of wafers according to the first recipe.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for wafer measurement, comprising:

generating a first recipe for measuring a first part of a plurality of wafers in a same batch, wherein the first part comprises a first semiconductor device, such that the first semiconductor device at the first part of the plurality of wafers in the same batch are identical;

generating a second recipe for measuring a second part of the plurality of wafers, wherein the second part comprises a second semiconductor device, such that the second semiconductor device at the second part of the plurality of wafers in the same batch are identical;

generating a measurement program associated with the first recipe and the second recipe; and controlling a measurement device, by executing the measurement program, to measure the first part of the plurality of wafers and the second part of the plurality of wafers according to the first recipe and the second recipe respectively;

wherein the controlling the measurement device comprises:

setting a plurality of first parameters corresponding to the first part of the plurality of wafers in the first recipe in order to measure the first semiconductor device of the first part of the plurality of wafers;

automatically switching from the plurality of first parameters to a plurality of second parameters corresponding to the second part of the plurality of wafers in the second recipe in order to measure the second semiconductor device of the second part of the plurality of wafers.

2. The method of claim 1, wherein the plurality of first parameters and the plurality of second parameters are different.

3. The method of claim 2, wherein the first part comprises a first number of wafers and the second part comprises a second number of wafers, wherein the first number of wafers and the second number of wafers are in the same batch.

4. The method of claim 3, wherein the plurality of first parameters includes a first probe pattern of probes of the measurement device;

wherein the plurality of second parameters includes a second probe pattern of probes of the measurement device;

wherein the measurement device is automatically controlled to switch from the first probe pattern of probes to the second probe pattern of probes to measure the second part after the first part is measured.

5. The method of claim 4, wherein the first probe pattern corresponds to and contacts of the first semiconductor device, wherein the second probe pattern corresponds to and contacts of the second semiconductor device.

6. The method of claim 3, wherein the plurality of first parameters includes a first measurement algorithm corresponding to a first arrangement of electrical property measurement;

wherein the plurality of second parameters includes a second measurement algorithm corresponding to a second arrangement of electrical property measurement;

wherein the measurement device is automatically controlled to switch from the first measurement algorithm to the second measurement algorithm to measure the second part after the first part is measured.

7. The method of claim 4, wherein the plurality of first parameters includes a first measurement temperature;

wherein the plurality of second parameters includes a second measurement temperature;

wherein the step of controlling the measurement device, by executing the measurement program, to measure the first part of the plurality of wafers according to the first recipe further comprises:

controlling a first thermal device of the measurement device, by executing the measurement program, to change a first measurement environment temperature to the first measurement temperature;

controlling the measurement device, by executing the measurement program, to measure the first part of the plurality of wafers according to the first recipe under the first measurement environment temperature;

controlling a second thermal device of the measurement device, by executing the measurement program, to change a second measurement environment temperature to the second measurement temperature; and controlling the measurement device, by executing the measurement program, to measure the second part of the plurality of wafers according to the second recipe under the second measurement environment temperature.

8. The method of claim 7, wherein the first thermal device and the second thermal device are a same single thermal device, such that the plurality of wafers are measured sequentially.

9. The method of claim 7, wherein the first thermal device and the second thermal device are two thermal devices, such that the plurality of wafers are measured in parallel.

10. The method of claim 1, wherein, by executing the measurement program, the measurement device is controlled to automatically measure the second part of the plurality of wafers according to the second recipe after measuring the first part of the plurality of wafers according to the first recipe, wherein each wafer of the first part of the wafers have a same first semiconductor device while each wafer of the second part of the wafers have a same second semiconductor device, such that each wafer has the first part and the second part in the same batch.

* * * * *